United States Patent
Dawes (10) Patent No.: US 7,157,970 B2
(45) Date of Patent: Jan. 2, 2007

(54) RAIL-TO-RAIL-INPUT BUFFER

(75) Inventor: Alan Dawes, Swindon (GB)

(73) Assignee: Infineon Technologies AG, Munich (DE)

( * ) Notice: Subject to any disclaimer, the term of this patent is extended or adjusted under 35 U.S.C. 154(b) by 159 days.

(21) Appl. No.: 10/927,947

(22) Filed: Aug. 27, 2004

(65) Prior Publication Data

US 2005/0083124 A1    Apr. 21, 2005

(30) Foreign Application Priority Data

Aug. 27, 2003 (EP) ................... 03255296

(51) Int. Cl.
*H03F 3/45* (2006.01)
(52) U.S. Cl. ................... 330/253
(58) Field of Classification Search ............. None
See application file for complete search history.

(56) References Cited

U.S. PATENT DOCUMENTS

| | | | |
|---|---|---|---|
| 4,636,743 A | | 1/1987 | Cotreau |
| 5,371,474 A | | 12/1994 | Wassenaar et al. |
| 5,500,624 A | * | 3/1996 | Anderson ............. 330/253 |
| 5,561,396 A | * | 10/1996 | Hogervorst et al. ....... 330/253 |
| 5,574,401 A | | 11/1996 | Spitalny |
| 5,745,007 A | * | 4/1998 | Redman-White ........ 330/253 |
| 6,392,485 B1 | | 5/2002 | Doi et al. |
| 6,518,842 B1 | | 2/2003 | Carter et al. |
| 2001/0052818 A1 | | 12/2001 | Suzuki |

FOREIGN PATENT DOCUMENTS

JP    2002043871 A    2/2002

* cited by examiner

*Primary Examiner*—Robert Pascal
*Assistant Examiner*—Krista M. Flanagan
(74) *Attorney, Agent, or Firm*—Maginot, Moore & Beck (57) ABSTRACT

A rail-to-rail-Input Buffer with constant mutual conductance includes a differential input; a first differential stage supplied with a first reference current; a second differential stage supplied with a second reference current; a switching PMOS-transistor which switches through when the input signal is higher than a first threshold voltage to divert the first reference current to a first current mirror circuit; a switching NMOS-transistor which switches through when an input signal is lower than a second threshold voltage to divert the second reference current to a second current mirror circuit; a third differential stage supplied with the mirrored first reference current and replaces the first differential stage when the input signal is higher than the first threshold voltage; and a fourth differential stage supplied with the mirrored second reference current and replaces the second differential stage when the input signal is lower than the second threshold voltage.

19 Claims, 5 Drawing Sheets

FIG 1  State of the art

FIG 2    State of the art

RAIL-TO-RAIL-INPUT BUFFER

FIELD OF THE INVENTION

The invention relates to a rail-to-rail-input buffer with constant mutual conductance having a composite P and N channel differential input pair.

BACKGROUND OF THE INVENTION

In many baseband applications a buffer/amplifier is required which possesses linear operation over an input signal range which extends across the full range of the supply voltage. These buffer/amplifiers are referred to as rail-to-rail-input buffers.

There are two basic types of conventional rail-to-rail-input buffers. In the first type a local high voltage on chip is used to drive a conventional differential input stage. This first type requires a charge pump and a clock signal. A clock signal is not necessarily available in a linear system. Further a clock signal contributes to additional noise.

A second type of rail-to-rail-input buffers use a composite P and N channel differential input pair. Composite N and P channel differential input pairs exist in a number of variants. For maintaining a constant mutual conductance gm the mutual conductance gm is controlled by the switching in and out current sources in the input differential pairs to maintain a constant mutual conductance gm or the input devices are run in a sub-threshold mode where the input currents are switched to obtain a constant mutual conductance gm.

Figure 1:
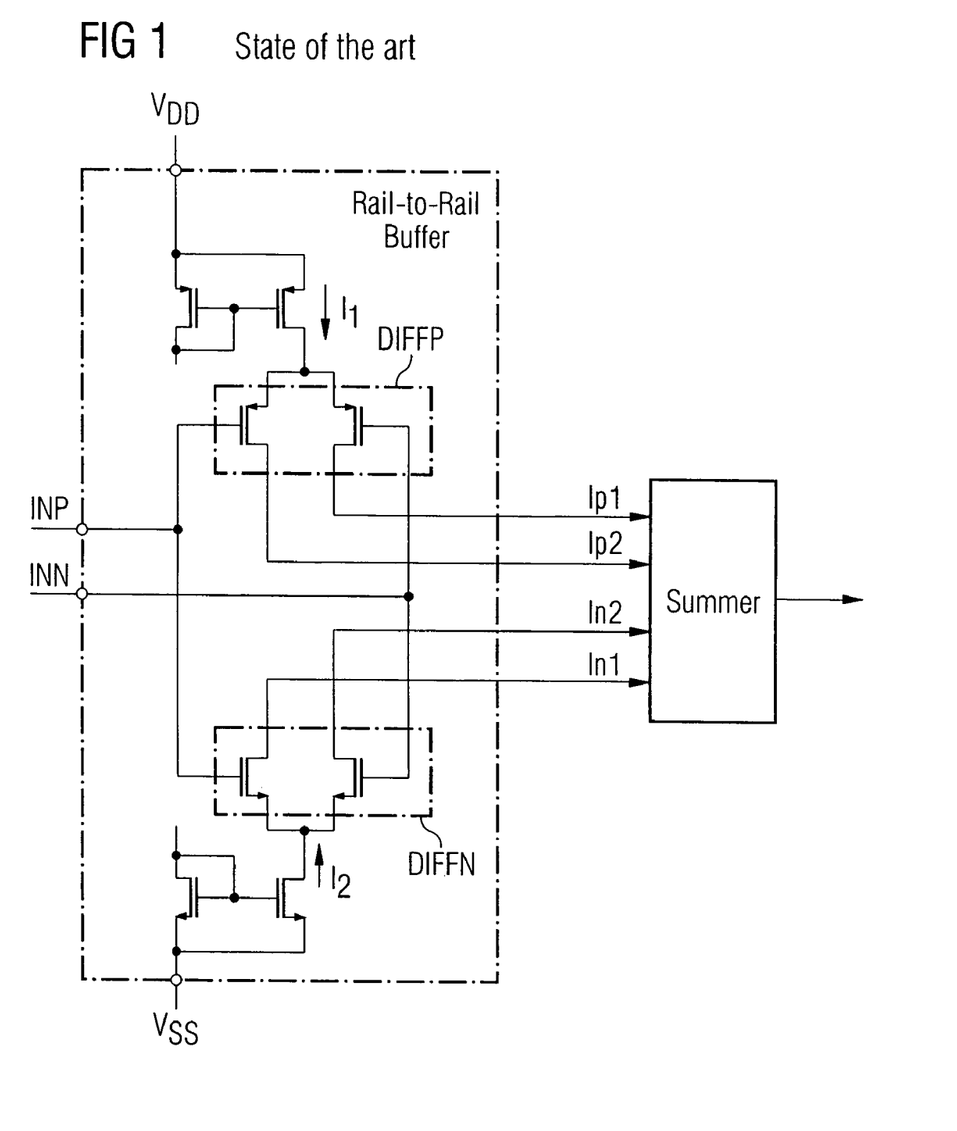
FIG. 1 shows a first rail-to-rail-input buffer according to the state of the art.

FIG. 1 shows a rail-to-rail-input buffer according to the state of the art. The rail-to-rail buffer as shown in FIG. 1 comprises a differential input having a first input terminal (INN) and a second input terminal (INP) for applying an input signal. The rail-to-rail buffer further comprises a first differential stage DIFFP and a second differential stage DIFFN. The two differential stages are supplied with reference currents I1, I2 respectively. The currents I1, I2 are generated by current sources which are connected to the differential stages. The two differential stages DIFFP and DIFFN are scaled to give the same mutual conductance gm:

gmp=gmn=GM for a given current. The state of the art rail-to-rail-input buffer as shown in FIG. 1 forms part of a circuit which ensures that the common mode voltage at the first input terminal INP and the second input terminal INN is the same, i.e. the INN voltage level tracks the INP input voltage level.

The rail-to-rail buffer according to the state of the art as shown in FIG. 1 has three regions of operation.

In a first middle common mode (CM) operation region both differential pairs DIFFP and DIFFN are contributing and the effective mutual conductance gm summed by the summer is 2×GM.

In a second high common mode (CM) operation region the first current I1 generated by the first common source is reduced to zero when the positive supply voltage VDD is approached. In this high common mode operation region the differential stage DIFFP is switched off and the overall mutual conductance gm is reduced to GM, i.e. only half of the mutual conductance gm in the first middle common mode operation region.

In a third low common mode (CM) operation region of the rail-to-rail buffer according to the state of the art the current I2 generated by the second current source is reduced to zero as the lower supply voltage VSS is approached. In this operation region the differential stage DIFFN is switched off and the overall mutual conductance gm is also reduced to GM, i.e. only half of the mutual conductance gm in the middle operation region. Accordingly the overall forward gain of the rail-to-rail buffer according to the state of the art as shown in FIG. 1 is halved at high in low common mode voltages.

A further disadvantage of the rail-to-rail buffer according to the state of the art as shown in FIG. 1 is that the summer is driven unbalanced in the high common mode operation region and in the low common mode operation region of the rail-to-rail buffer.

Figure 2:
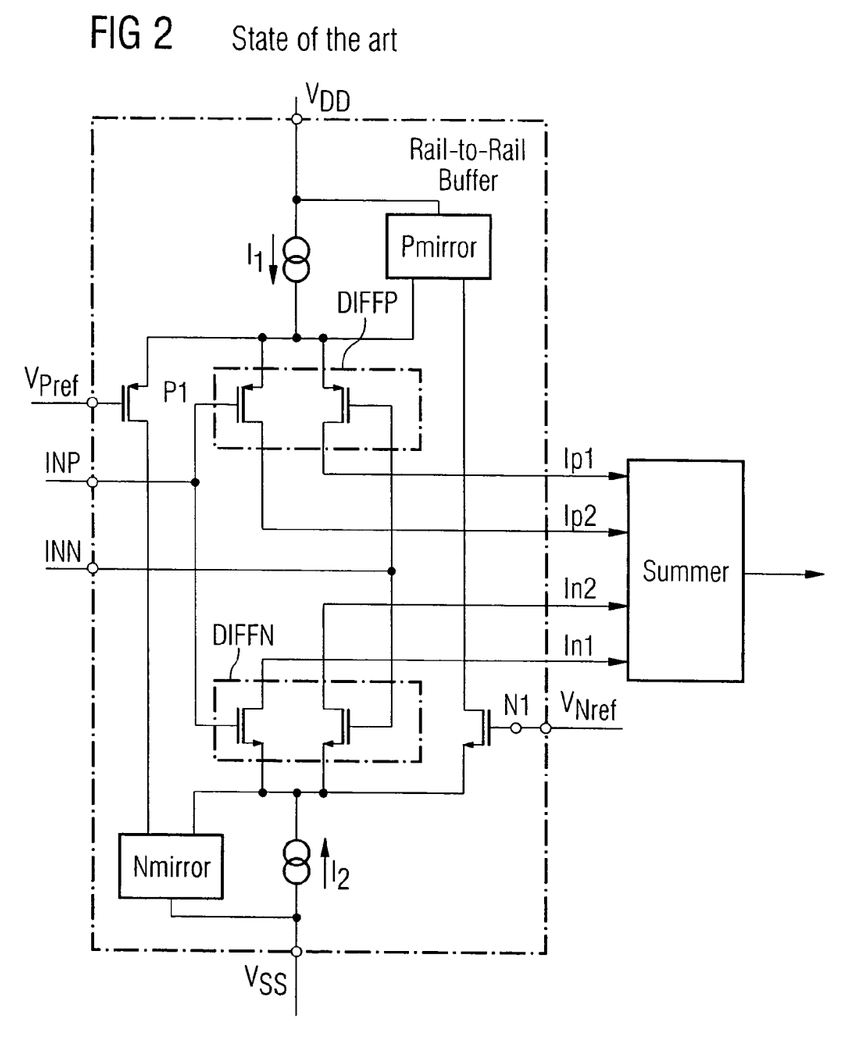
FIG. 2 shows a second rail-to-rail-input buffer according to the state of the art.

To overcome this disadvantage a rail-to-rail buffer has been proposed by U.S. Pat. No. 5,574,401 as shown in FIG. 2. The rail-to-rail buffer according to the state of the art as shown in FIG. 2 comprise additional current mirror circuits (Pmirror and Nmirror) and switching transistors P1, N1. The switching transistors P1, N1, are supplied with reference voltages $V_{pref}$ and $V_{nref}$. The reference voltages set the levels in which the common mode input level switches the circuitry into the high or low operation regions. The rail-to-rail buffer according to the state of the art as shown in FIG. 2 also comprises three regions of operations.

In a first middle common mode (CM) operation region both switching transistors P1 and N1 are off and the rail-to-rail buffer functions exactly as the rail-to-rail buffer shown in FIG. 1. Both differential stages DIFFP and DIFFN are contributing in this operation mode a effective mutual conductance gm which is summed up by the summer of 2×GM.

In a second high common voltage operation region, that is when common mode input voltage on input terminals INP and INN is higher than the reference voltage $V_{pref}$ supplied to the gate of P1, a current I1 generated by the first current source is redirected through PMOS-transistor P1 and applied to a first current mirror circuit Nmirror. The first current mirror circuit Nmirror multiplies the applied current with a constant multiplying factor, e.g. by a factor 3. The first differential stage DIFFP is switched off when the current I1 is diverted to the Nmirror circuit. The current flowing through the second differential stage is quadrupled by mirroring and multiplying the first reference current I1. When the NMOS-transistor within the second differential stage DIFFN are long channel transistors then the mutual conductance gm is also doubled because the NMOS-transistors are square law devices.

In a third low common mode operation region of the rail-to-rail buffer as shown in FIG. 2, that is when the common mode input voltage supplied to the input terminal INP and INN are lower then the reference voltage VNREF supplied to the gate of the switching transistor N1, the current I2 generated by the second current source is redirected through the NMOS-transistor N1 and the second differential stage DIFFN is switched off. The redirected second reference current I2 is mirrored and multiplied by a second mirror circuit Pmirror by a constant multiplying factor of e.g. three. The currents flowing to the first differential stage DIFFP are then quadrupled. When the PMOS-transistors within the first differential stage are long-channel transistors the mutual conductance is doubled when the PMOS-transistors are square law devices.

The rail-to-rail buffer according to the state of the art as shown in FIG. 2 has as a primary disadvantage that it relies on long-channel devices, e.g. long-channel MOS-transistors within the differential stages DIFFP and DIFFN. The rail-to-rail buffer according to the state of the art can only maintain a constant forward gain when the NMOS-transistors have a square law gm characteristic. When the dimensions of the MOS-transistor within the rail buffer become 100 small a square law current/gm characteristic is no longer fulfilled. Accordingly a rail-to-rail buffer having small dimensions will not provide a constant mutual conductance gm over the full input signal range.

A secondary disadvantage of the rail-to-rail buffer as shown in FIG. 2 is in that the summer is driven unbalanced in the high and low common mode operation regions.

Accordingly it is the object of the present invention to provide a rail-to-rail-input buffer having a constant mutual conductance gm over the full input signal range wherein the geometric dimensions of the integrated elements can be minimised without affecting the mutual conductance.

SUMMARY

This object is achieved by a rail-to-rail buffer according to embodiments of the invention.

Figure 3:
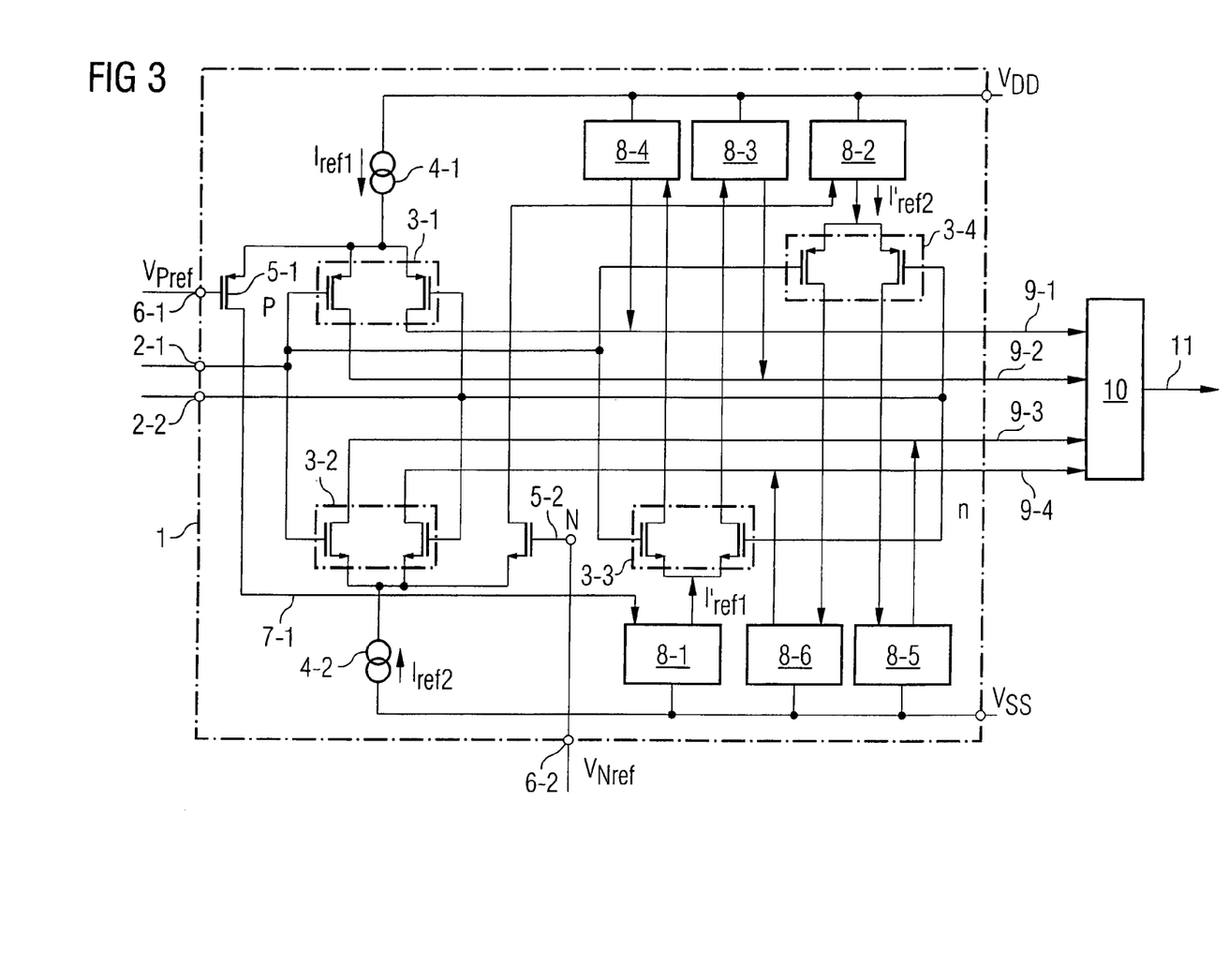
FIG. 3 shows a preferred embodiment of the rail-to-rail-input buffer according to the present invention.

An embodiment of the invention, shown iS FIG. 3, provides a rail-to-rail buffer with constant mutual conductance (gm) comprising:
  (a) a differential input (2) having a first input terminal (2-1) and a second input terminal (2-1) for applying an input signal;
  (b) a first differential stage (3-1) supplied with a first reference current ($I_{ref1}$), wherein the first differential stage (3-1) is formed by PMOS-transistors having gate terminals connected to the input terminals (2-1, 2-2);
  (c) a second differential stage (3-2) supplied with a second reference current ($I_{ref2}$) wherein the second differential stage (3-2) is formed by NMOS-transistors having gate terminals connected to the input terminals (2-1, 2-2);
  (d) a switching PMOS-transistor (5-1) which switches through when the input signal is higher than a predetermined first threshold voltage ($V_{TH1}$) to divert the first reference current ($I_{ref1}$) supplied to the first differential stage (3-1) to a first current mirror circuit (8-1) which mirrors the first reference current ($I_{ref1}$);
  (e) a switching NMOS-transistor (5-2) which switches through when the input signal is lower than a predetermined second threshold voltage ($V_{TH2}$) to divert the second reference current ($I_{ref2}$) supplied to the second differential stage (3-2) to a second current mirror circuit (8-2) which mirrors the second reference current ($I_{ref2}$);
  (f) a third differential stage (3-3) formed by NMOS-transistors having gate terminals connected to the input terminals (2-1, 2-2);

wherein the third differential stage (3-3) is supplied with the mirrored first reference current ($I_{ref}$) and replaces the first differential stage (3-1) when the input signal is higher than the first threshold voltage; and
  (g) a fourth differential stage (3-4) formed by PMOS-transistors having gate terminals connected to the input terminals (2-1, 2-2);

wherein the fourth differential stage (3-4) is supplied with the mirrored second reference current (Iref') and replaces the second differential stage (3-2) when the input signal is lower than the second threshold voltage.

A first advantage of the rail-to-rail-input buffer according to the present invention resides in that it provides a proportional, related to the input voltage, push-pull output current drive through the summer over the full rail-to-rail-input signal range. Consequently distortion at the extremes of the input voltage range is reduced.

A second advantage of the rail-to-rail input buffer according to the present invention is that a fixed DC biasing is maintained to the output summer over the whole input signal range. Thus the distortion at extremes of the input voltage is lowered.

In a preferred embodiment of the rail-to-rail-input buffer according to the present invention the switching PMOS-transistors has a gate terminal which is supplied with a first reference voltage.

In a preferred embodiment the switching NMOS-transistor has a gate terminal which is supplied with a second reference voltage.

In a further embodiment the first referenced current is generated by the first reference current source connected to the first differential stage.

In a preferred embodiment the second reference current is generated by a second reference current source connected to the second differential stage.

In a first preferred embodiment the first differential stage is formed by two PMOS-transistors having drain terminals connected with the first current source and having source terminals which are connected to output current lines.

In a preferred embodiment of the rail-to-rail-input buffer according to the present invention the second differential stages is formed by two NMOS-transistors having drain terminals connected to the second current source and having source terminals connected to output current lines.

In a preferred embodiment the first current mirror circuit is formed by two NMOS-transistors having gate terminals which are connected to each other.

In a preferred embodiment the second current mirror circuit is formed by two PMOS-transistors having gate terminals which are connected to each other.

In a further preferred embodiment the third differential stage is formed by two NMOS-transistors having drain terminals connected to the first current mirror circuit and having source terminals connected to the third current mirror circuit and to a fourth current mirror circuit which mirror the output currents of the third differential stage to the output current lines.

In a further preferred embodiment the fourth differential stage is formed by two PMOS-transistors having drain terminals connected to the second current mirror circuit and having source terminals connected to a fifth current mirror circuit and to a sixth current mirror circuit which mirror the output currents of the fourth differential stage to the output current lines.

The provision of the third, fourth, fifth and sixth current mirror circuit has the advantage that the summer connected to the rail-to-rail-input buffer is driven symmetrically. This gives a proportional, related to the input voltage, push-pull output current drive to the summer circuit over the full rail-to-rail-input signal range. This helps to reduce distortion at extremes of the input voltage range.

In the following preferred embodiments of the rail-to-rail-input buffer according to the present invention are described in detail with reference to the enclosed figures.

DETAILED DESCRIPTION

As can be seen from FIG. 3 the rail-to-rail-input buffer 1 according to the present invention has a differential input having a first input terminal 2-1 and a second input terminal 2-2 for supplying an input signal.

A first differential stage 3-1 is supplied with a first reference current $I_{ref1}$ which is generated by a first reference current source 4-1. The first differential stage 3-1 is formed by two PMOS-transistors having gate terminals which are connected to the input terminals 2-1, 2-2.

The rail-to-rail-input buffer 1 comprises a second differential stage 3-2 supplied with a second reference current $I_{ref2}$ generated by a second reference current source 4-2. The second differential stage 3-2 is formed by two NMOS-transistors having gate terminals which are connected to the input terminals 2-1, 2-2 of the rail-to-rail-input buffer 1.

The rail-to-rail-input buffer 1 further comprises a first switching transistor 5-1 and a second switching transistor 5-2 in the embodiment shown in FIG. 3. The first switching transistor 5-1 is a PMOS-transistor and the second switching transistor 5-2 is an NMOS-transistor. The gate of the PMOS-transistor 5-1 is connected to a reference input terminal 6-1 of the rail-to-rail-input buffer 1 for applying a first reference voltage $V_{pref}$. The gate of the second switching transistor 5-2 is connected to a second reference input terminal 6-2 of the rail-to-rail-input buffer 1 for applying a second reference voltage $V_{nref}$. The first switching PMOS-transistor 5-1 is switched on when the input signal applied to the input terminals 2-1, 2-2 is higher then a predetermined first threshold voltage. In this case the first reference current $I_{ref1}$ generated by the first reference current source 4-1 is diverted from the first differential stage 3-1 via a line 7-1 to a first current mirror circuit 8-1 which mirrors the first reference current $I_{ref1}$ and generates a first mirrored current $I_{ref1'}$.

The second switching NMOS-transistor 5-2 is switched on when the input signal applied to the input terminals 2-1, 2-2 is lower than a predetermined second threshold voltage and diverts a second reference current $I_{ref2}$ generated by the second reference current source 4-2 from the second differential stage 3-2 via a current line 7-2 to a second current mirror circuit 8-2 which mirrors the second reference current $I_{ref2}$ to a mirrored reference current $I_{ref2'}$.

The rail-to-rail input buffer 1 according to the present invention as shown in FIG. 3 comprises a third differential stage 3-2 formed by two NMOS-transistors having gate terminals connected to the input terminals 2-1, 2-2 of the rail-to-rail-input buffer 1. The third differential stage 3-2 is supplied with the mirrored first reference current $I_{ref1'}$ and replaces the first differential stage 3-1 when the input signal is higher then the first threshold voltage adjusted via reference input terminal 6-1.

The rail-to-rail-input buffer 1 according to the present invention further comprises a fourth differential stage 3-4 formed by PMOS-transistors having gate terminals which are connected to the input terminals 2-1, 2-2 of the rail-to-rail-input buffer 1. The fourth differential stage 3-4 is supplied with the mirrored second reference current $I_{ref2'}$ and replaces the second differential stage 3-2 when the input signal applied to the input terminals 2-1, 2-2 is lower then the second threshold voltage adjusted via the input reference terminal 6-2.

The first differential stage 3-1 of the rail-to-rail-input buffer 1 comprises two PMOS-transistors having drain terminals connected to the first current source 4-1 and having source terminals which are connected to output current lines 9-1, 9-2.

The second differential stage 2-2 is formed by two NMOS-transistors having drain terminals connected to the second current source 4-2 and having source terminals connected to output current lines 9-3, 9-4.

The four output current lines 9-1, 9-2, 9-3, 9-4 of the rail-to-rail-input buffer 1 according to the present invention are connected to inputs of a current summing circuit 10 which sums up the currents supplied through the output current lines to a sum current which is output via an output line 11.

The third differential stage 3-3 is formed by two NMOS-transistors having drain terminals connected to the first current mirror circuit 8-1 and having source terminals connected to the third current mirror circuit 8-3 and to a fourth current mirror circuit 8-4. The current mirror circuits 8-3, 8-4 mirror the output currents of the third differential stage 3-3 to the output current lines 9-1 and 9-2.

The fourth differential stage 3-4 of the rail-to-rail buffer 1 is formed by two PMOS-transistors having drain terminals connected to the second current mirror circuit 8-2 and having source terminals connected through a fifth current mirror circuit 8-5 and to a sixth current mirror circuit 8-6. The two current mirror circuits 8-5, 8-6 mirror the output currents of the fourth differential stage 3-4 to the output current lines 9-3, 9-4.

As can be seen from FIG. 3 the rail-to-rail-input buffer 1 according to the present invention comprises four differential stages 3-1, 3-2- 3-3, 3-4, two reference current sources 4-1, 4-2, two switching transistors 5-1, 5-2 and six current mirror circuits 8-1 to 8-6. The current mirror circuits 8-1 to 8-6 are supplied with the supply voltages VDD, VSS. A current summing circuit 10 sums up the output current of the rail-to-rail-input buffer 1.

In the normal operation of the rail-to-rail-input buffer 1 according to the present invention the input terminal 2-1, 2-2 are operated at the same common mode voltage $V_{cm}$. The output current lines drive differentially the current summer circuit 10. The current summing up circuit 10 sums up the currents correctly phased.

The input signal range of the rail-to-rail-input buffer 1 according to the present invention has three zones of operation. These operation regions are determined by the reference voltages $V_{pref}$, $V_{nref}$ applied to the reference terminals 6-1, 6-2 and by the threshold voltages of the switching transistors 5-1, 5-2.

In the first operation zone of the rail-to-rail-input buffer 1 according to the present invention with the common mode input level at mid-supply the first differential stage 3-1 and the second differential stage 3-3 are operating and are running at a current $I=I_{ref1}=I_{ref2}$ generated by the two current sources 4-1, 4-2. Differential output currents are supplied from the first differential stage 3-1 to the summer 10 via output current line 9-1, 9-2 and from the second differential stage 3-2 via output current lines 9-3, 9-4. In the first operation zone of the rail-to-rail-input buffer 1 the third differential stage 3-3 and the fourth differential stage 3-4 are off.

In the second operation zone of the rail-to-rail-input buffer 1 according to the present invention with the common mode input signal level approaching the high supply voltage VDD the first differential stage 3-1 is off and the reference current $I_{ref1}$ generated by the first reference current source 4-1 is diverted via the conductive PMOS-transistor 5-1 and a current line 7-1 to the first current mirror circuit 8-1 causing the third differential stage 3-3 to be switched on. The differential stage 3-2 is also on in the second operation zone of the rail-to-rail-input buffer 1. The fourth differential stage 3-4 is switched off. In the second operation zone the third differential stage 3-3 becomes a substitute for the switched off first differential stage 3-1 so that the total mutual conductance gm remains constant. The current through the third differential stage 3-3 is mirrored by the mirror circuit 8-3, 8-4 to drive the differential output current line 9-1, 9-2. This causes the output current drive into the summer 10 to remain push-pull, i.e. the current summing circuit 10 is driven symmetrically by both sides so that there is no change from the driving situation when the the common mode level is at mid-supply.

In a third operation zone with the common mode input signal approaching the lower supply voltage VSS the second differential stage 3-2 is switched off. The same applies to the third differential stage 3-3 which is also switched off in this operation zone. The reference current $I_{ref2}$ generated by the second reference current source 4-2 is diverted via the second switching transistor 5-2 to the second current mirror circuit 8-2 causing the fourth differential stage 3-4 to be switched on. The first differential stage 3-1 is also switched on. In the third operation zone the switched off differential stage 3-2 is substituted by the fourth differential stage 3-4 so that the total mutual conductance gm remains constant. The current through the fourth differential stage 3-4 is mirrored by the current mirror circuits 8-5, 8-6 to drive the differential output current lines 9-3, 9-4. This causes the output current drive into the current summing circuit 10 to remain push-pull, i.e. symmetrically driven by both sides, so that there is no change from the driving situation with the common mode level being at mid-supply.

The rail-to-rail-input buffer 1 according to the present invention is also operable when the MOS-transistors integrated in the rail-to-rail-input buffer 1 are no long-channel MOS-transistors having a square law relationship between the mutual conductance and the channel length. Consequently the rail-to-rail-input buffer 1 according to the present invention can be fabricated with new short channel processes without degrading its performance.

The current mirror circuits 8-3, 8-4, 8-5, 8-6 provide a push-pull output current drive to the current summing circuit 10 over the full rail-to-rail-input signal range. Accordingly the distortion at the extreme values of the input voltage is reduced. The rail-to-rail-input buffer 1 according to the present invention is a differential rail-to-rail-input buffer which is formed symmetrically.

Figure 4A:
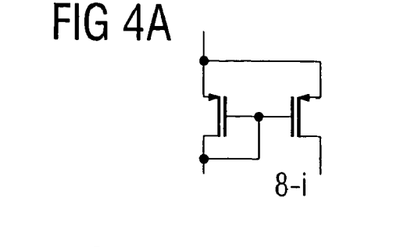
FIG. 4a, FIG. 4b show preferred embodiments of the current mirror circuits employed by the rail-to-rail-input buffer according to the present invention.

FIG. 4A shows a preferred embodiment of the P-current mirror circuits 8-2, 8-3, 8-4 used in the rail-to-rail-input buffer 1 according to the present invention.

Figure 4B:
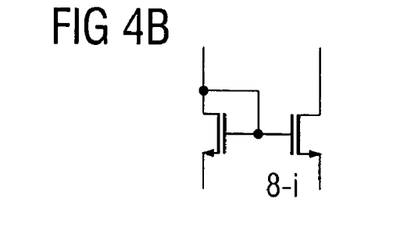

FIG. 4B shows a preferred embodiment of the N-current mirror circuits 8-1, 8-5, 8-6 used in the rail-to-rail-input buffer 1.

The current mirror circuits mirror the current multiplied with a factor 1 or with an adjustable multiplying factor. A typical supply voltage VDD for the rail-to-rail-input buffer 1 is 5 Volt whereas the low reference voltage VSS has zero Volt. In this case the voltage applied to the first referenced terminal 6-1 can be 3.5 Volt and the voltage supplied for the second reference terminal 6-2 can be 1.5 Volt.

Figure 5:
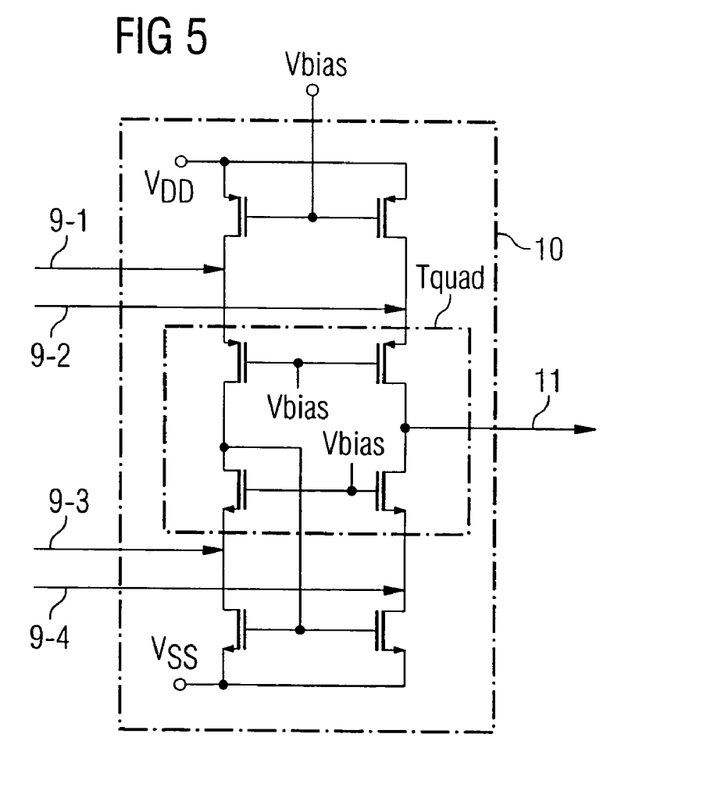
FIG. 5 shows a preferred embodiment of current summing circuit for summing up output currents of the rail-to-rail-input buffer according to the present invention.

FIG. 5 shows the preferred embodiment of the current summing circuit 10 connected to the rail-to-rail-input buffer 1 according to the present invention. The current summing circuit 10 sums up the four output currents supplied from the rail-to-rail-input buffer 1. The current summing circuit 10 is supplied with a biasing voltage $V_{bias}$ so that the DC current through the summer 10 is kept constant across all three operation zones of the rail-to-rail-input buffer 1 according to the present invention. The impedances and voltage levels within the summer 10 are also kept constant by applying the biasing voltage Vbias. The fixed DC biasing lowers the distortion at extreme values of the input voltage.

Figure 6:
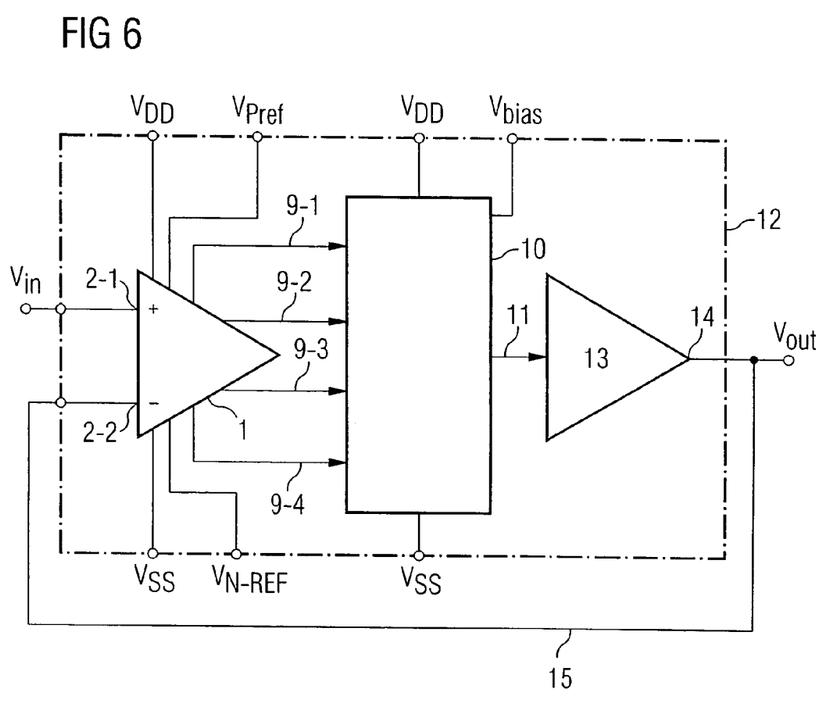
FIG. 6 shows a driving circuit including a rail-to-rail-input buffer according to the present invention.

FIG. 6 shows a preferred embodiment of a driving circuit 12 comprising a rail-to-rail-input buffer 1 according to the resent invention. The rail-to-rail-input buffer 1 receives incoming signals $V_{IN}$ at its first input terminal 2-1. The output current rails 9-1, 9-2, 9-3, 9-4 of the rail-to-rail-input buffer 1 are connected to a current summing circuit 10 which sums up the applied current to the sum current $I_{out}$. The output current $I_{out}$ is applied to a rail-to-rail-output stage driver 13 having an output terminal 14 connected to the second terminal 2-2 of the rail-to-rail-input buffer 1 via a feedback line 15. The rail-to-rail-driving circuit 12 forms a unity gain rail-to-rail-voltage follower, i.e. the output voltage $V_{out}$ at the output terminal 14 of the output stage driver 13 corresponds to the input voltage $V_{in}$ applied to the first input terminal 2-1 of the rail-to-rail-input buffer 1.

List of Reference Numbers
1 rail-to-rail-input buffer
2 input terminals
3 differential stages
4 reference current sources
5 switching transistors
6 reference inputs
7 current lines
8 current mirror circuits
9 output current lines
10 current summing circuit
11 line
12 driving circuit
13 output stage driver
14 output terminal
15 feedback line

The invention claimed is:
1. A buffer circuit comprising:
a differential input configured to receive an input signal;
a first differential stage supplied with a first reference current, the first differential stage comprising PMOS-transistors having gate terminals connected to the differential input;
a second differential stage supplied with a second reference current, the second differential stage comprising NMOS-transistors having gate terminals connected to the differential input;
a switching PMOS-transistor operable to, when the input signal is higher than a predetermined first threshold voltage, divert the first reference current from the first differential stage to a first current mirror circuit configured to mirror the first reference current;
a switching NMOS-transistor operable to, when the input signal is lower than a predetermined second threshold voltage, divert the second reference current from the second differential stage to a second current mirror circuit configured to mirror the second reference current;

a third differential stage comprising NMOS-transistors having gate terminals connected to the differential input, wherein the third differential stage is configured to receive the mirrored first reference current when the input signal is higher than the first threshold voltage;

a fourth differential stage comprising PMOS-transistors having gate terminals connected to the differential input, wherein the fourth differential stage is configured to receive the mirrored second reference current when the input signal is lower than the second threshold voltage;

a third current mirror circuit operably connected to receive a first output current of the third differential stage, and operable to mirror the first output current of the third differential stage to a first output current line; and a fourth current mirror circuit operably connected to receive a second output current of the third differential stage, and operable to mirror the second output current of the third differential stage to a second output current line; and wherein the third differential state comprises two NMOS-transistors having drain terminals connected to the first current mirror circuit.

2. The buffer circuit according to claim 1 wherein the switching PMOS-transistor includes a gate terminal operably coupled to receive a reference voltage.

3. The buffer circuit according to claim 1 wherein the switching NMOS-Transistor includes a gate terminal operably coupled to receive a reference voltage.

4. The buffer circuit according to claim 1 wherein the first differential stage comprises two PMOS-transistors having drain terminals operably connected to a source of the first reference current and having source terminals operably connected to first and second output current lines.

5. The buffer circuit according to claim 4 wherein the second differential stage comprises two NMOS-transistors having drain terminals connected to a source of the second reference current and having source terminals operably connected to third and fourth output current lines.

6. The buffer circuit according to claim 5 wherein the first, second, third and fourth output current lines are connected to a current summing circuit, the current summing circuit operable to sum currents on the first, second, third and fourth output current lines to generate an output sum current.

7. The buffer circuit according to claim 6 wherein the current summing circuit is operably connected to provide the output sum current to an output stage driver.

8. The buffer circuit according to claim 1 wherein the first current mirror circuit comprises two NMOS-transistors having interconnected gate terminals.

9. The buffer circuit according to claim 1 wherein the second current mirror circuit comprises two PMOS-transistors having interconnected gate terminals.

10. The buffer circuit according to claim 1 further comprising:

a fifth current mirror circuit operably connected to receive a first output current of the fourth differential stage, and operable to mirror the first output current of the fourth differential stage to a third output current line; and a sixth current mirror circuit operably connected to receive a second output current of the fourth differential stage, and operable to mirror the second output current of the fourth differential stage to a fourth output current line; and wherein the fourth differential stage comprises two PMOS-transistors having drain terminals connected to the second current mirror circuit.

11. The buffer circuit according to claim 1 further comprising:

a third current mirror circuit operably connected to receive a first output current of the fourth differential stage, and operable to mirror the first output current of the fourth differential stage to a third output current line; and a fourth current mirror circuit operably connected to receive a second output current of the fourth differential stage, and operable to mirror the second output current of the fourth differential stage to a fourth output current line; and wherein the fourth differential stage comprises two PMOS-transistors having drain terminals connected to the second current mirror circuit.

12. The buffer circuit according to claim 1, further comprising:

a current summing circuit configured to generated a summed output current; and an output stage driver operably coupled to amplify the summed output current, the output stage driver including an output operably coupled to an input terminal of the differential input.

13. A buffer circuit having first, second and third operating states, the buffer circuit comprising:

a differential input configured to receive an input signal;

a first differential stage supplied with a first reference current, the first differential stage comprising PMOS-transistors having gate terminals connected to the differential input, the first differential stage configured to generate output currents when the buffer circuit is in the first operating state and when the buffer circuit is in the second operating state;

a second differential stage supplied with a second reference current, the second differential stage comprising NMOS-transistors having gate terminals connected to the differential input, the second differential stage configured to generate output currents when the buffer circuit is in the second operating state and when the buffer circuit is in the third operating state;

a third differential stage comprising NMOS-transistors having gate terminals connected to the differential input, wherein the third differential stage is configured to generate output currents when the buffer circuit is in the third operating state;

a fourth differential stage comprising PMOS-transistors having gate terminals connected to the differential input, wherein the fourth differential stage is configured to generate output currents when the buffer circuit is in the first operating state;

a third current mirror circuit operably connected to receive a first output current of the third differential stage, and operable to mirror the first output current of the third differential state to a first output current line; and a fourth current mirror circuit operably connected to receive a second output current of the third differential stage, and operable to mirror the second output current of the third differential stage to a second output current line; and wherein the third differential stage comprises two NMOS-transistors having drain terminals connected to the first current mirror circuit.

14. The buffer circuit of claim 13, wherein the first, second, third and fourth differential stages are operably coupled to a current summing circuit.

15. The buffer circuit of claim 13, further comprising a first switch operably coupled to divert the first reference current away from the first differential stage when the buffer circuit is in the third operating state.

16. The buffer circuit of claim 15, further comprising a second switch operably coupled to divert the second reference current away from the second differential stage when the buffer circuit is in the first operating state.

17. The buffer circuit of claim 15, wherein the first switch comprises a PMOS-transistor.

18. The buffer circuit of claim 15 further comprising a first current mirror coupled between the first switch and the third differential stage.

19. The buffer circuit of claim 15 further comprising a first current mirror coupled between a first output of the third differential stage and a buffer circuit output, and a second current mirror coupled between a second output of the third differential stage and the buffer circuit output.

* * * * *